United States Patent
Reiss et al.

(10) Patent No.: US 10,281,090 B2
(45) Date of Patent: May 7, 2019

(54) LIGHTING DEVICE AND CORRESPONDING MANUFACTURING METHOD

(71) Applicant: OSRAM GmbH, Munich (DE)

(72) Inventors: Martin Reiss, Sinzing (DE); Roberto Didone', Rosà (IT); Luigi Pezzato, Treviso (IT); Lorenzo Baldo, Giavera del Montello (IT)

(73) Assignee: OSRAM GMBH, Munich (DE)

( * ) Notice: Subject to any disclaimer, the term of this patent is extended or adjusted under 35 U.S.C. 154(b) by 0 days.

(21) Appl. No.: 15/877,409

(22) Filed: Jan. 23, 2018

(65) Prior Publication Data

US 2018/0209591 A1     Jul. 26, 2018

(30) Foreign Application Priority Data

Jan. 24, 2017 (IT) .................. 102017000007393

(51) Int. Cl.
    *F21S 4/20*      (2016.01)
    *F21S 4/22*      (2016.01)
    (Continued)

(52) U.S. Cl.
CPC .............. *F21K 9/237* (2016.08); *F21S 4/20* (2016.01); *F21V 15/01* (2013.01); *F21V 29/70* (2015.01);
(Continued)

(58) Field of Classification Search
CPC .............. H01L 51/5237; H01L 51/524; H01L 51/5253; H05B 33/04; H05B 33/0803;
(Continued)

(56) References Cited

U.S. PATENT DOCUMENTS

| | | | |
|---|---|---|---|
| 5,110,369 A * | 5/1992 | Tornstrom | H01L 31/048 |
| | | | 136/244 |
| 7,217,004 B2 * | 5/2007 | Park | F21K 9/00 |
| | | | 362/240 |

(Continued)

FOREIGN PATENT DOCUMENTS

| | | |
|---|---|---|
| DE | 202011000916 U1 | 6/2011 |
| EP | 2892078 A1 | 7/2015 |

(Continued)

OTHER PUBLICATIONS

Italian Search Report based on application No. 201700007393 (7 pages) dated Jun. 29, 2017 (Reference Purpose Only).

(Continued)

*Primary Examiner* — Joseph L Williams
*Assistant Examiner* — Jose M Diaz
(74) *Attorney, Agent, or Firm* — Viering Jentschura & Partner MBB

(57) ABSTRACT

A lighting device comprising: an elongated laminar substrate having opposed front and back surfaces, one or more electrically-powered light radiation sources, e.g. LED sources, at the front surface of the substrate, a protective encapsulation sealingly encapsulating the substrate and the light radiation source(s), the encapsulation being light-permeable to facilitate propagation of light radiation from the device. The encapsulation includes thermally-conductive material at the back surface of the substrate.

12 Claims, 4 Drawing Sheets

(51) Int. Cl.

| | |
|---|---|
| *F21K 9/237* | (2016.01) |
| *F21V 15/01* | (2006.01) |
| *F21V 29/00* | (2015.01) |
| *F21V 29/70* | (2015.01) |
| *F21V 29/87* | (2015.01) |
| *F21V 31/04* | (2006.01) |
| *H05B 33/08* | (2006.01) |
| *F21Y 103/10* | (2016.01) |
| *F21Y 115/10* | (2016.01) |

(52) U.S. Cl.
CPC ......... *F21V 31/04* (2013.01); *H05B 33/0803* (2013.01); *F21S 4/22* (2016.01); *F21V 29/00* (2013.01); *F21V 29/87* (2015.01); *F21Y 2103/10* (2016.08); *F21Y 2115/10* (2016.08)

(58) Field of Classification Search
CPC .......... F21K 9/237; F21V 29/70; F21V 29/00; F21V 29/87; F21V 31/04; F21V 15/01; F21S 4/20; F21S 4/22; F21Y 2103/102; F21Y 115/10
See application file for complete search history.

(56) References Cited

U.S. PATENT DOCUMENTS

| | | | |
|---|---|---|---|
| 9,753,321 B2* | 9/2017 | Lu .................... | G02F 1/133516 |
| 2010/0328947 A1 | 12/2010 | Chang et al. | |
| 2011/0241528 A1* | 10/2011 | Choi .................... | H01L 51/524 |
| | | | 313/317 |
| 2012/0181915 A1* | 7/2012 | Yamamoto .......... | H01L 51/5237 |
| | | | 313/46 |
| 2013/0153880 A1* | 6/2013 | Yamamoto .......... | H01L 51/5246 |
| | | | 257/40 |
| 2014/0171561 A1* | 6/2014 | Nakabayashi ............. | C08J 7/00 |
| | | | 524/101 |
| 2014/0196284 A1 | 7/2014 | Volpato et al. | |
| 2014/0268771 A1* | 9/2014 | Heikman .............. | F21V 29/004 |
| | | | 362/249.02 |
| 2016/0380233 A1* | 12/2016 | Motomura .............. | C08F 20/00 |
| | | | 257/40 |
| 2017/0009973 A1 | 1/2017 | Michielan et al. | |
| 2017/0152419 A1* | 6/2017 | Rantala ................ | C08K 5/0025 |
| 2017/0336038 A1* | 11/2017 | Kim .................... | H01L 27/156 |
| 2018/0151655 A1* | 5/2018 | Kim .................... | H01L 27/1218 |
| 2018/0158880 A1* | 6/2018 | Kim ........................ | H01L 51/00 |
| 2018/0204985 A1* | 7/2018 | Li .......................... | F21V 19/005 |

FOREIGN PATENT DOCUMENTS

| | | |
|---|---|---|
| WO | 2013040289 A2 | 3/2013 |
| WO | 2013068532 A1 | 5/2013 |

OTHER PUBLICATIONS

European Search Report based on application No. 18152940.5 (7 pages) dated Apr. 18, 2018 (Reference Purpose Only).

* cited by examiner

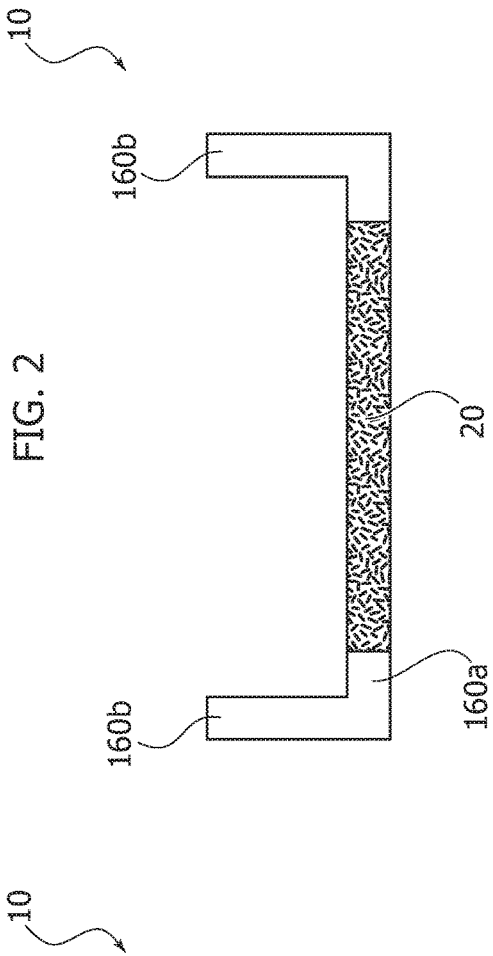
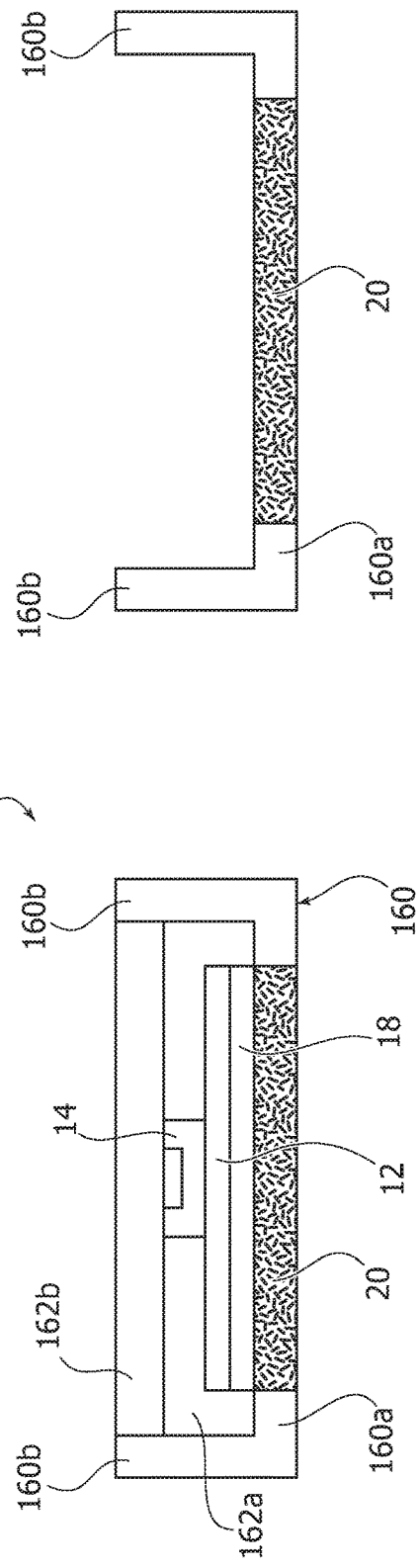

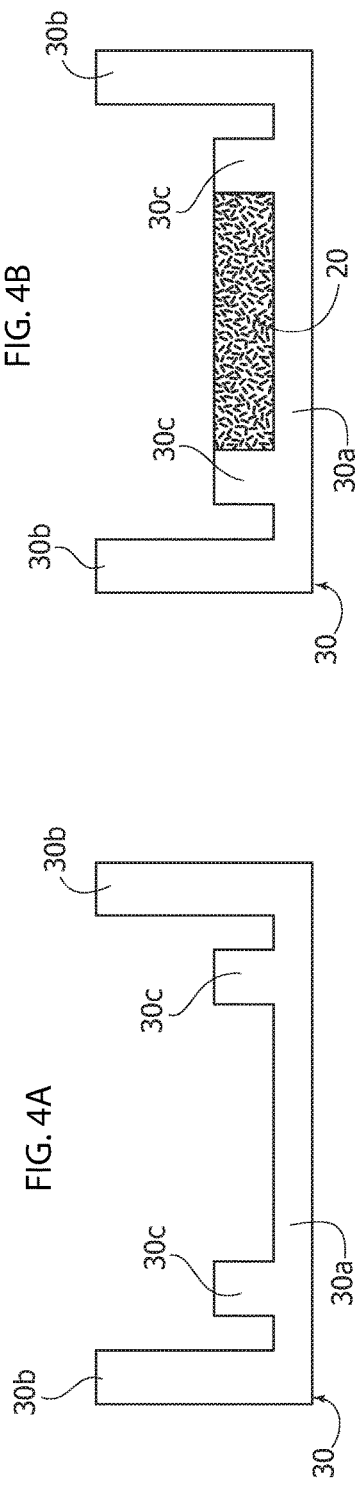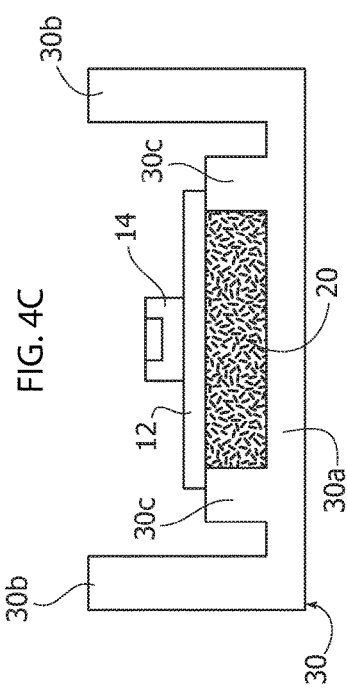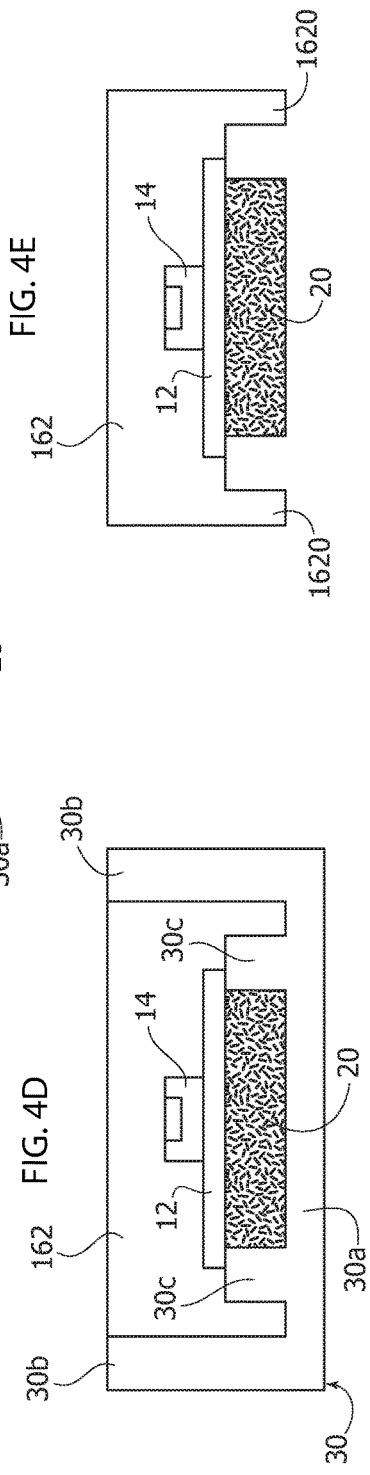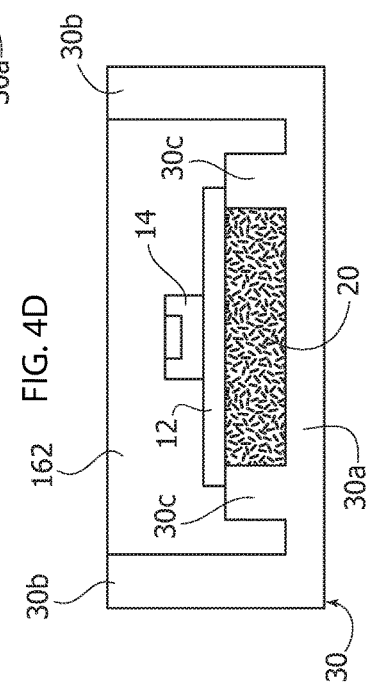

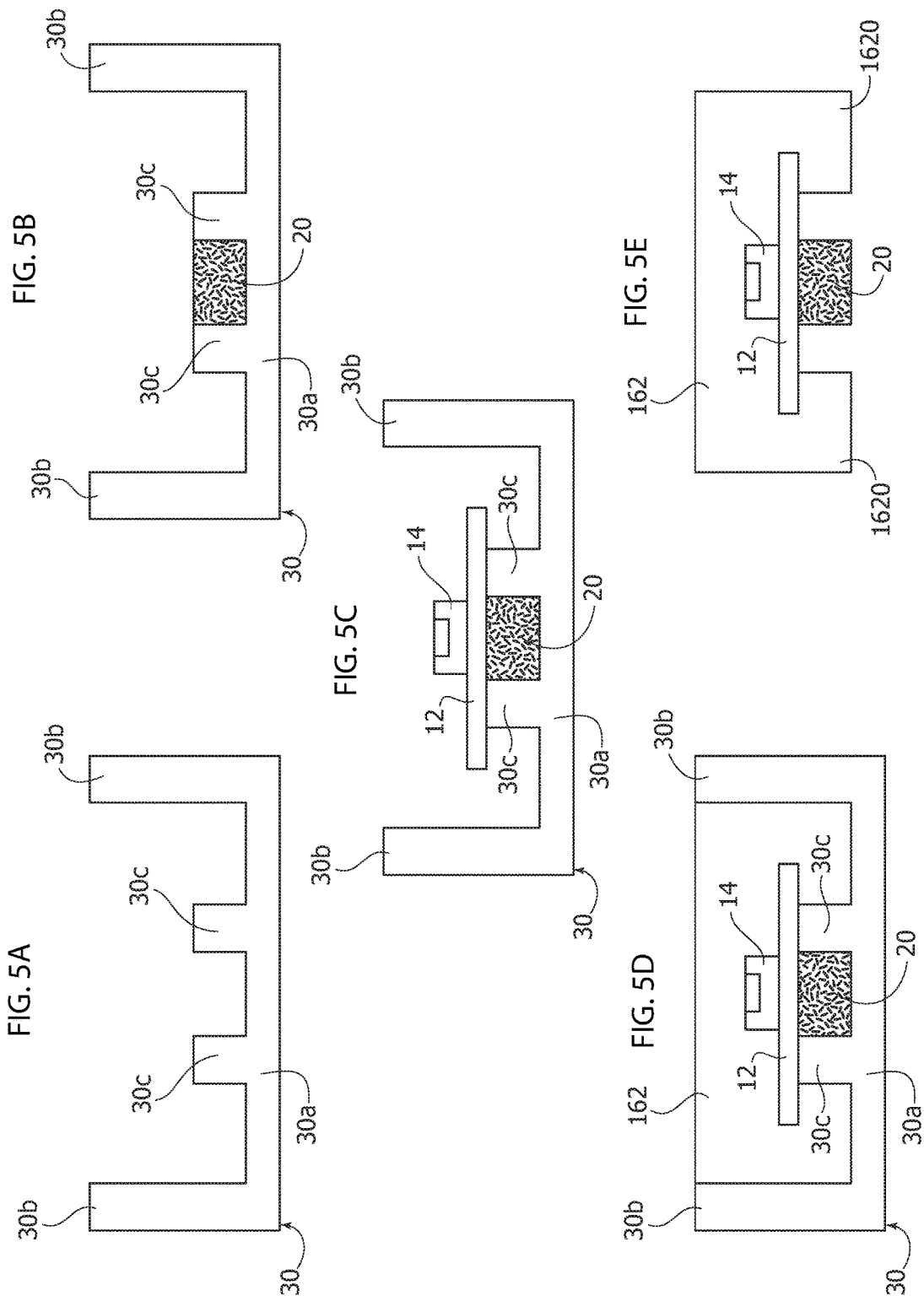

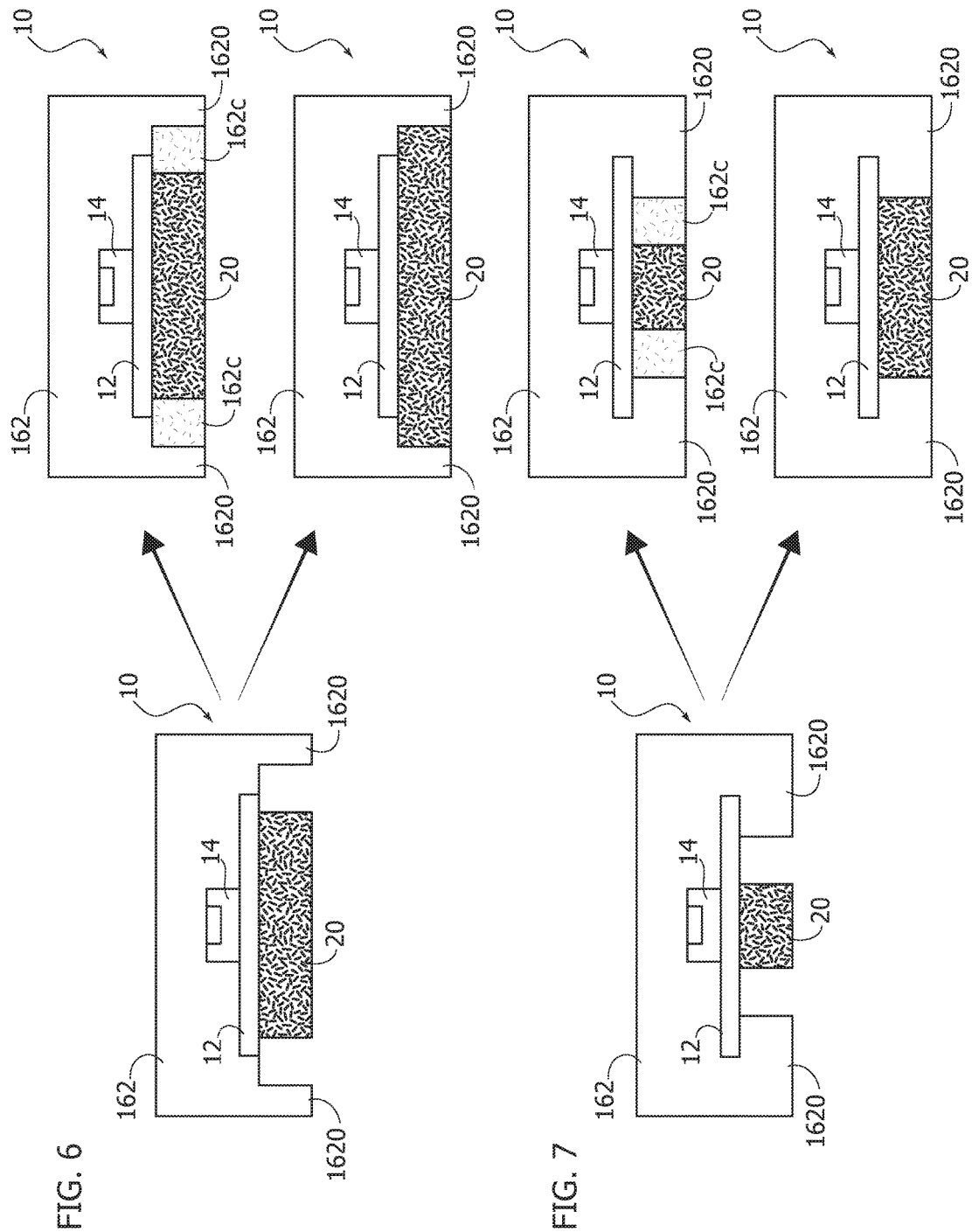

LIGHTING DEVICE AND CORRESPONDING MANUFACTURING METHOD

CROSS-REFERENCE TO RELATED APPLICATION

This application claims priority to Italian Patent Application Serial No. 102017000007393 IT, which was filed on Jan. 24, 2017, and is incorporated herein by reference in its entirety.

TECHNICAL FIELD

The present description relates to lighting devices.

One or more embodiments may be applied to lighting devices employing electrically powered light radiation sources such as solid-state sources, e.g. LED sources.

BACKGROUND

In the lighting sector the use is spreading of devices or modules adapted to be implemented in ribbon shape, or generally as elongated elements.

These devices or modules may be provided in a protected version against the penetration of foreign agents, e.g. with an IP protection grade.

Particularly when employing light radiation sources (e.g. LED sources) having medium to high power, the problem may arise of dissipating the heat generated by the light radiation sources in operation: as a matter of fact, the encapsulation or potting materials which may be employed to achieve the protection against the penetration of foreign agents may offer low heat dissipation properties due e.g. to the low thermal conductivity of the materials employed, e.g. polymer materials.

This problem has been tackled with e.g. by providing the device substrate (substantially similar to a Printed Circuit Board, PCB) with a given internal heat dissipation capability, e.g. thanks to the use of thermally-conductive layers, made e.g. of copper, having a specific structure. This solution, which may make the device implementation intrinsically more complex and expensive, is not to be considered as wholly satisfactory.

SUMMARY

One or more embodiments aim at overcoming the previously outlined drawbacks.

According to one or more embodiments, said object may be achieved thanks to a lighting device having the features set forth in the claims that follow.

One or more embodiments may refer to a corresponding method.

The claims are an integral part of the technical teaching provided herein with reference to the embodiments.

One or more embodiments may offer one or more of the following advantages:
  possibility of increasing the light output power, e.g. per length unit of the module;
  the improved heat dissipation properties do not significantly affect the geometry of the lighting device; specifically, no elements are visible from the outside (e.g. from above or from the side), which may have a negative impact on the appearance of the device;
  possibility of devising the heat dissipation properties according to flexible design criteria, the heat dissipation being adapted to be provided (only) where it is needed, the possibility being given e.g. of adjusting the width of the dissipating elements as a function of the position and/or the width of the area hosting the light radiation sources (e.g. the LED sources);
  adaptability of the heat dissipation properties to the application and usage needs (the level of heat dissipation being adapted to the type and power of the light radiation sources);
  possibility of handling the devices, both in production and in use, according to criteria substantially resembling those of traditional devices;
  possibility of using currently available materials, without the need of employing special, possibly rather expensive, materials;
  possibility, at least in some embodiments, of entrusting to the supplier of components the task of providing the heat dissipation elements, without imposing disadvantageous modifications also as regards the subsequent use of said components; in most cases the substitution of one given element, e.g. a bi-adhesive tape, is all that will be required, so as to obtain heat conductive properties.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a lighting device according to one or more embodiments, viewed in cross section, FIG. 2 highlights features of a component shown in FIG. 1, FIG. 3 shows a lighting device according to one or more embodiments, viewed in cross section, FIGS. 4A-4E and 5A-5E, show in combination possible embodiments of a method according to embodiments, FIG. 6 and FIG. 7 show, once again in combination, possible embodiments of a method according to embodiments.

DESCRIPTION

In the following description, one or more specific details are given to provide a thorough understanding of the exemplary embodiments according to the present description. The embodiments may be practiced without one or several specific details, or with other methods, components, materials, etc. In other instances, well-known structures, materials, or operations are not shown or described in detail in order to avoid obscuring various aspects of the embodiments.

Reference throughout this specification to "one embodiment" or "an embodiment" means that a particular feature, structure, or characteristic described in connection with the embodiment is included in at least one embodiment. Thus, the possible appearances of the phrases "in one embodiment" or "in an embodiment" in various places throughout this specification are not necessarily all referring to the same embodiment. Furthermore, particular features, structures, or characteristics may be combined in any suitable manner in one or more embodiments.

The headings provided herein are for convenience only, and therefore do not interpret the extent of protection or scope of the embodiments.

In the Figures, reference 10 generally denotes a lighting device. In one or more embodiments, it may be an elongated (e.g. ribbon-shaped, optionally flexible) lighting device, currently denoted as "module" or "flex" (if it exhibits flexibility).

In the Figures, said device is shown in cross section, as it may be considered, at least theoretically, as having indefinite length, the possibility being given of cutting it to length according to the application and usage needs.

In one or more embodiments, said device may include a laminar substrate 12, substantially similar to a Printed Circuit Board (PCB) having two opposed sides or surfaces.

A first surface or side thereof (which may be identified as a front or upper face, above in the Figures) may host one or more electrically powered light radiation sources 14.

One or more embodiments may include solid-state light radiation sources, such as e.g. LED sources.

Such structures are known in the art (also as regards the possible presence of electrically conductive formations, which may be connected to the source(s) 14 in order to provide power supply, and optionally control signals, to the latter), which makes it unnecessary to provide a more detailed description herein.

In one or more embodiments, device 10 may include a protective encapsulation, i.e. a sealing housing which sealingly encapsulates substrate 12 and source(s) 14, so as to provide device 10 with a protection against the penetration of foreign agents, e.g. an IP degree protection.

In one or more embodiments as exemplified in FIG. 1, said sealing encapsulation may include a channel-shaped housing 160 (shown in FIG. 2 only) e.g. of a flexible silicone material, having a central (or bottom) wall 160a and two lateral walls 160b, extending sidewise of central wall 160a. As may be seen e.g. in FIG. 1, in one or more embodiments the assembly of substrate 12 and of source(s) 14 may be located within the channel shape of housing 160, the back wall (or lower wall, below in the Figures) of substrate 12 facing towards central wall 160a, with the possible interposition, in one or more embodiments, of a thermally-conductive layer (e.g. a thermally-conductive glue).

In one or more embodiments as exemplified in FIG. 1, said sealing encapsulation may be completed with a potting or sealing mass which may include, in one or more embodiments:

- a first material 162a (e.g. a material at least partially impermeable to light, e.g. a white silicone material) which is adapted to mask from the outside substrate 12 and optional electrical/electronic circuits/components arranged on the substrate, while leaving the light output surface of source(s) 14 exposed, and
- a second, light-permeable material 162b (e.g. a transparent silicone material) which may enable the propagation of the light radiation emitted by source(s) 14 outwardly of device 10 (upwards as viewed in the Figures).

At the same time, the sealing mass (including, in the presently considered and merely exemplary case, two materials 162a, 162b having different light propagation properties) extends from the one to the other of the lateral walls 160b of housing 160, so as to facilitate the achievement of a protection against the penetration of foreign agents.

In one or more embodiments, the lateral walls 160a may include (at least at their mutually opposed inner surfaces, e.g. the surfaces facing inwardly of the channel shape of housing 160) light reflective properties (light colour, possible mirror finishing, etc.), so as contribute to send back, outwardly of device 10, the light radiation generated by source(s) 14.

In one or more embodiments, housing 160 may include, e.g. at the bottom wall 160a, a thermally-conductive material 20 adapted to cooperate, in a heat-transfer relationship, with substrate 12 (optionally through layer 18, if present). In this way, it is possible to favour the dissipation, from substrate 12 outwardly of housing 160, and therefore outwardly of device 10, of the heat generated by source(s) 14 in operation.

It has moreover been observed that, at least theoretically, such a solution might also be employed in the potting or sealing mass (exemplified in FIG. 1 by materials 162a, 162b), e.g. by embedding, into said mass, filler particles e.g. of $Al_2O_3$ or BN. Said choice might however reduce the light permeability properties of said materials, especially at the light output surface of light radiation source(s) 14.

Moreover, it has been observed that solutions as exemplified in the Figures (a thermally-conductive material 20 in a heat-exchange relationship with substrate 12) enable keeping the structure of substrate 12 unchanged, without envisaging therein heat dissipating elements/components/formations such as metal formations beneath source(s) 14.

In one or more embodiments, the thermally-conductive material 20 may be embedded into the encapsulation (e.g. into housing 160) during the manufacturing of device 10, e.g. when housing 160 is produced via an extrusion process (e.g. 2K-extrusion).

In one or more embodiments, the thermally-conductive material 20 may comprise e.g. a matrix of silicone/polyurethane/elastomeric material having, dispersed therein, thermally-conductive particles such as e.g. titan oxide/aluminium oxide/metal powders/carbon/graphite/boron nitride or nanotubes, such as e.g. Carbon Nano Tubes (e.g. TUBAL of OCSiAl).

At least theoretically, material 20 may be provided as an e.g. metal strip. This choice, however, may give rise to the drawback of an excessively rigid structure, or may have a negative impact on manufacturing flexibility, e.g. as exemplified in FIGS. 4 to 7, so as to offer a high implementation flexibility.

FIGS. 4 to 7 refer, by way of example, to the implementation of a device 10 as exemplified in FIG. 3, wherein substrate 12 carrying the light radiation source(s) 14 is shown in direct contact with the thermally-conductive material 20, which may be implemented according to the previously explained criteria.

FIGS. 4 and 5 exemplify (in mutual combination) various possible method steps which may be implemented in order to obtain a device 10 as exemplified in FIG. 3, by using a mould 30.

In one or more embodiments, mould 30 may have a general channel shape, with a bottom wall 20a, two lateral walls 30b and two formations or ribs 30c protruding upwards from the bottom wall 30a within the channel shape of mould 20.

In one or more embodiments, mould 30 may therefore include:

- a central mould cavity located between ribs 30c, and
- a pair of lateral mould cavities, each located between a lateral wall 30b and a rib 30c facing the latter.

In one or more embodiments, mould 30 may have a generally symmetrical shape, i.e. with two lateral walls 30b having the same height, ribs 30c also having the same height (e.g. lower than the height of lateral walls 30b) and with the ribs 30c being located at the same distance from the lateral walls 30b on both sides of the mould.

However, it will be appreciated that such conditions (especially the last condition mentioned) may not be strictly mandatory for implementing the embodiments.

FIGS. 4 and 5 exemplify possible different choices as regards the spacing between ribs 30c. For example, FIG. 4 shows a possible "wide" spacing between ribs 30c, while FIG. 5 shows a possible "narrow" spacing between said ribs 30c.

FIGS. 4A and 5A exemplify the possibility, in one or more embodiments, of providing a mould 30 wherein, in the mould cavity between ribs 30c, a mass of thermally-conductive material 20 is dispensed, as discussed in the foregoing: see FIGS. 4B and 5B.

Subsequently, onto the filling of thermally-conductive material 20 (which is assumed as filling the mould cavity into which it has been dispensed) it is possible to apply substrate 12 carrying the light radiation source(s) 14: see FIGS. 4C and 5C.

In the case exemplified in FIG. 5, the "narrow" spacing between the ribs 30c may cause the side edges of substrate 12 to protrude not only beyond the thermally-conductive material 20, but also beyond ribs 30c.

In one or more embodiments, within the mould 30 containing the thermally-conductive material 20, the substrate 12 and the light radiation source(s) 14, it is then possible to dispense a sealing mass 162: see FIGS. 4D and 5D.

In one or more embodiments, said mass may include either a single material or a plurality (e.g. two) of materials having different light propagation properties, such as masses 162a, 162b previously mentioned with reference to FIGS. 1 and 2. For simplicity of representation, FIGS. 4 to 7 refer to a mass 162 including one material.

In one or more embodiments, the assembly including the thermally-conductive material 20, the substrate 12, the light radiation source(s) 14 and the sealing mass 162 may be separated by the mould 30 (i.e., the mould 30 is removed) leaving as a residue a structure as exemplified in FIGS. 4E and 5E, i.e. a structure wherein the sealing material 162 may have two side extensions 1620 deriving from the penetration of the sealing mass 162 into the side groove-like mould cavities, located between the lateral walls 30b and the ribs 30c of mould 30.

In one or more embodiments, it has been ascertained that the choice, for the extensions 1620, of a thickness (measured transversely of device 10) not lower than 1 mm may favour carrying out the operations exemplified in the Figures.

In any case, the side extensions 1620 are spaced from the thermally-conductive material 20 by a distance corresponding to the width of ribs 30c.

As a consequence, if ribs 30c have a wide spacing (FIG. 4), the thermally-conductive mass 20 has a corresponding width, while the extensions 1620 are generally narrow.

Conversely, if ribs 30c have a narrow spacing, the thermally-conductive material 30 will have a correspondingly reduced width, while the extensions 1620 will be generally wide.

This observation highlights the intrinsic features of design and/or implementation flexibility of one or more embodiments.

Said features further appear in FIGS. 6 and 7, which exemplify, respectively with reference to the previous steps shown in FIG. 4 (in the case of FIG. 6) and to the previous steps shown in FIG. 5 (in the case of FIG. 7), various manners to fill the gap or spacing between the thermally-conductive material 20 and the extensions 1620 of the sealing material 162.

For example, FIGS. 6 and 7 exemplify the possibility of filling said gap or spacing (so as to complete the encapsulation of substrate 12 and of the source(s) 14 carried thereon) starting from an "intermediate product" as shown in FIGS. 4E and 5E:

with a material 162c similar or equal to the material(s) of mass 162, as a transparent or diffusive (e.g. polymer) material; see FIG. 6 or 7 top right, or with a further thermally-conductive material, similar or equal to the material denoted as 20: see FIG. 6 or 7 bottom right.

In one or more embodiments, the area and the thickness of the thermally-conductive material which is adapted to perform heat dissipation may therefore be adjusted both by selecting the structure of mould 30 and by selecting the filling criteria of the gaps between extensions 1620 and the thermally-conductive material 20 dispensed in the mould cavity between ribs 30c.

One or more embodiments may therefore concern a lighting device (e.g. 10) including:

an elongated laminar substrate (e.g. 12) having opposed front and back surfaces, at least one electrically-powered light radiation source (e.g. 14) at the front surface of the substrate, a protective encapsulation (e.g. 160, 162a, 162b, 20 in FIG. 1 or 162, 20 in FIG. 3) sealingly encapsulating the substrate and the at least one light radiation source, the encapsulation being light-permeable at the at least one light radiation source to facilitate propagation of light radiation from the device, the encapsulation including thermally-conductive material (e.g. 20) facing the back surface of the substrate.

One or more embodiments may include a flexible substrate encapsulated by a flexible encapsulation.

In one or more embodiments, the thermally-conductive material may include a matrix having thermally-conductive particles dispersed therein.

One or more embodiments may include a thermally-conductive layer (e.g. 18) between the back surface of the substrate and the encapsulation (e.g. the bottom wall 160a of housing 160).

In one or more embodiments:

the encapsulation may include a channel-shaped housing (e.g. 160) having a central wall (e.g. 160a) and lateral walls (e.g. 160b) laterally of the central wall, the housing including thermally-conductive material at the central wall, the substrate with the at least one light radiation source may be located in the channel-shape of the housing, with the back surface of the substrate towards the central wall of the housing, and the encapsulation may include a sealing mass (e.g. 162a, 162b) extending over the front surface of the substrate and the at least one light radiation source from the one to the other of the lateral walls of the housing.

In one or more embodiments, the lateral walls of the housing may include mutually facing light-reflective surfaces.

In one or more embodiments, the at least one light radiation source may include a LED source.

In one or more embodiments, a method of manufacturing a lighting device may include:

providing an elongated laminar substrate having opposed front and back surfaces, providing at least one electrically-powered light radiation source at the front surface of the substrate, sealingly encapsulating the substrate and the at least one light radiation source with a protective encapsulation light-permeable at the at least one light radiation source, to facilitate propagation of light radiation from the device, including thermally-conductive material in the encapsulation, at a position facing the back surface of the substrate.

One or more embodiments may include:

providing a channel-shaped mould (e.g. 30) including a bottom wall (e.g. 30a), lateral walls (e.g. 30b) extending sidewise of the bottom wall, and a pair of ribs (e.g. 30c) protruding from the bottom wall inwardly of the channel shape of the mould, the ribs defining a central mould cavity therebetween, as well as lateral mould cavities between the ribs and the lateral walls of the mould, dispensing thermally-conductive material into the central mould cavity, to provide a thermally-conductive filling therein, coupling the laminar substrate with the thermally-conductive filling in the central mould cavity, dispensing into the mould a sealing mass (e.g. 162) to sealingly cover the front surface of the substrate and the at least one light radiation source thereon, the sealing mass penetrating into said lateral mould cavities to provide side extensions (e.g. 1620) of the sealing mass sidewise of and spaced to the thermally-conductive material in the central mould cavity, disengaging from the mould the laminar substrate with the at least one light radiation source thereon coupled with said thermally-conductive material and said sealing mass, and dispensing into the spacings between the thermally-conductive material and said side extensions of the sealing mass one of:

transparent or light diffusive material (e.g. 162c), or thermally-conductive material.

In one or more embodiments, the thermally-conductive material may include a matrix having thermally-conductive particles dispersed therein.

Without prejudice to the basic principles, the implementation details and the embodiments may vary, even appreciably, with respect to what has been described herein by way of non-limiting example only, without departing from the extent of protection.

The extent of protection is determined by the annexed claims.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A lighting device, comprising:
    an elongated laminar substrate having opposed front and back surfaces,
    at least one electrically-powered light radiation source at the front surface of the substrate,
    a protective encapsulation sealingly encapsulating the substrate and the at least one light radiation source, the encapsulation being light-permeable at the at least one light radiation source to facilitate propagation of light radiation from the device, the encapsulation including thermally-conductive material facing the back surface of the substrate;
    wherein the encapsulation comprises a channel-shaped housing having a central wall and side walls laterally of the central wall, the housing including thermally-conductive material at the central wall,
    the substrate with the at least one light radiation source is located in the channel-shape of the housing with the back surface of the substrate towards the central wall of the housing,
    the encapsulation comprises a sealing mass extending over the front surface of the substrate and the at least one light radiation source from the one to the other of the side walls of the housing.

2. The lighting device of claim 1, further comprising a flexible substrate encapsulated by a flexible encapsulation.

3. The lighting device of claim 1, wherein the thermally-conductive material comprises a matrix having thermally-conductive particles dispersed therein.

4. The lighting device of claim 1, further comprising a thermally-conductive layer between the back surface of the substrate and the encapsulation.

5. The lighting device of claim 1, wherein:
    the encapsulation further comprises a sealing mass extending over the at least one light radiation source from the one to the other of the side walls of the housing.

6. The lighting device of claim 1, wherein the side walls of the housing comprises mutually facing light-reflective surfaces.

7. The lighting device of claim 1, wherein the at least one light radiation source comprises an LED source.

8. A method of manufacturing a lighting device, the method comprising:
    providing an elongated laminar substrate having opposed front and back surfaces,
    providing at least one electrically-powered light radiation source at the front surface of the substrate,
    sealingly encapsulating the substrate and the at least one light radiation source with a protective encapsulation light-permeable at the at least one light radiation source to facilitate propagation of light radiation from the device,
    including thermally-conductive material in the encapsulation at a position facing the back surface of the substrate;
    providing a channel-shaped mould comprising a bottom wall, lateral walls extending sidewise of the bottom wall and a pair of ribs protruding from the bottom wall inwardly of the channel shape of the mould, the ribs defining a central mould cavity therebetween and a pair of lateral mould cavities between the protruding ribs and the lateral walls of the mould,
    dispensing thermally-conductive material into the central mould cavity to provide a thermally-conductive filling therein,
    coupling the laminar substrate with the thermally-conductive filling in the central mould cavity,
    dispensing into the mould a sealing mass to sealingly cover the front surface of the substrate.

9. The method of claim 8, further comprising:
    dispensing into the mould a sealing mass to sealingly cover the at least one light radiation source, the sealing mass penetrating into said lateral mould cavities to provide side extensions of the sealing mass sidewise of and spaced to the thermally-conductive material in the central mould cavity, disengaging from the mould the laminar substrate with the at least one light radiation source thereon coupled with said thermally-conductive material and said sealing mass, and dispensing into the spacings between the thermally-conductive material and said side extensions of the sealing mass one of:
  a transparent or light diffusive material, or
  a thermally-conductive material.

10. The method of claim 8, wherein the thermally-conductive material further comprises a matrix having thermally-conductive particles dispersed therein.

11. A lighting device, comprising:
an elongated laminar substrate having opposed front and back surfaces,
at least one electrically-powered light radiation source at the front surface of the substrate,
a protective encapsulation sealingly encapsulating the substrate and the at least one light radiation source, the encapsulation being light-permeable at the at least one light radiation source to facilitate propagation of light radiation from the device, the encapsulation including thermally-conductive material facing the back surface of the substrate;
a channel-shaped mould comprising a bottom wall and lateral-walls which extend sidewise of the bottom wall and a pair of ribs which protrude from the bottom wall inwardly of the channel shape of the mould,
wherein the ribs define a central mould cavity therebetween and a pair of lateral mould cavities between the protruding ribs and the lateral walls of the mould,
a thermally-conductive material is arranged in the central mould cavity,
wherein the laminar substrate and the thermally-conductive material in the central mould cavity are coupled,
wherein a sealing mass is arranged to sealingly cover the front surface of the substrate.

12. The lighting device of claim 11,
wherein the sealing mass is further arranged to sealingly cover the at least one light radiation source,
wherein the sealing mass is arranged such that it penetrates into the lateral mould cavities to provides side extensions of the sealing mass sidewise of the thermally-conductive material in the central mould cavity and spaced to the thermally-conductive material in the central mould cavity,
wherein the laminar substrate with the at least one light radiation source coupled with the thermally conductive material and the sealing mass is disengagable from the mould, and
wherein, one of:
  a transparent or light diffusive material, or
  a thermally-conductive material,
is arranged between the thermally conductive material and the side extensions of the sealing mass.

* * * * *